(12) United States Patent
Yang

(10) Patent No.: US 7,825,507 B2
(45) Date of Patent: Nov. 2, 2010

(54) SEMICONDUCTOR ASSEMBLY AND METHOD FOR FORMING SEAL RING

(75) Inventor: Chin-Sheng Yang, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 12/247,234

(22) Filed: Oct. 8, 2008

(65) Prior Publication Data

US 2010/0084735 A1 Apr. 8, 2010

(51) Int. Cl.
*H01L 29/06* (2006.01)
(52) U.S. Cl. .................. 257/710; 257/E23.077
(58) Field of Classification Search .............. 257/506, 257/710, 725, E23.077
See application file for complete search history.

(56) References Cited

U.S. PATENT DOCUMENTS

| 7,354,799 | B2 | 4/2008 | Kinderknecht et al. |
| 2007/0035001 | A1* | 2/2007 | Kuhmann et al. ........... 257/680 |
| 2007/0105370 | A1* | 5/2007 | Kinderknecht et al. ...... 438/637 |
| 2008/0081404 | A1* | 4/2008 | Barna et al. ................. 438/197 |

* cited by examiner

*Primary Examiner*—Thomas L Dickey
(74) *Attorney, Agent, or Firm*—Winston Hsu; Scott Margo; Min-Lee Teng

(57) ABSTRACT

A method for forming a seal ring is disclosed. First, a substrate including a MEMS region, a logic region and a seal ring region is provided. Second, a trench is formed in the MEMS region and multiple recesses are formed in the seal ring region. An oxide fills the trench and the recesses. Later, a MOS is form in the logic region and a dielectric layer is formed on the substrate. Then, an etching procedure is carried out to partially remove the dielectric layer and simultaneously remove the oxide in the multiple recesses completely to form a seal ring space. Afterwards, a metal fills the seal ring space to from the seal ring.

20 Claims, 6 Drawing Sheets

SEMICONDUCTOR ASSEMBLY AND METHOD FOR FORMING SEAL RING

BACKGROUND OF THE INVENTION

1. Field of the Invention

The present invention relates to a method to form a seal ring and a semiconductor assembly. In particular, the present invention relates to a method to form a seal ring by means of semiconductor process and a seal ring for use in a micro electro mechanical system (MEMS).

2. Description of the Prior Art

The micro electro mechanical system (MEMS) is a tiny device with both the electronic and mechanical functions. Apart from the traditional electronic and mechanical processing methods, the current micro electro mechanical system is done by micro-processing techniques. The current methods to manufacture the micro electro mechanical system are, for example, silicon-based method, the LIGA method and the polymer method. Considering the cost for the mass production, the well-developed semiconductor process is much favored to manufacture the micro electro mechanical system due to its potential capability.

Because the micro electro mechanical system is a tiny device with both the electronic and mechanical functions, it is naturally very susceptible to the damages of the contaminations, such as impurities, small particles or mechanical stress, from the surroundings. Therefore, a solution is needed to protect the micro electro mechanical system from any undesirable damages. In order to protect the fragile and vulnerable parts in the micro electro mechanical system from damages and contaminations from the surroundings, one of the direct solutions is to leave the entire micro electro mechanical system in a hermetically sealed cavity. Such hermetically sealed cavity is called a sealing ring. Currently methods are proposed to form the sealing ring.

U.S. Pat. No. 7,354,799 proposes a method to form the sealing ring. The method for forming such seal ring is, firstly, to directly etch the silicon substrate to form multiple vias for use in anchoring the seal ring by using a patterned photo resist as an etching mask. Secondly, the seal ring is formed on the silicon substrate by a serious of steps, such as the formation of a seed layer, a dielectric layer, a patterned photo resist layer and metal deposition on the silicon substrate. However, in accordance with the method to form the seal ring disclosed in U.S. Pat. No. 7,354,799, i.e. directly etching the silicon substrate to form multiple vias for use in anchoring the seal ring in the silicon substrate, is not a standard operation for the conventional semiconductor process to form vias. In other words, it is not a good solution which is not compatible with the standard semiconductor process.

Since it is widely accepted that the well developed semiconductor process techniques are suitable to manufacture the micro electro mechanical system, the industry surely looks forward to using a method which is compatible with the standard semiconductor process to form the seal ring. The applicant therefore acknowledges the urgent demand to utilize the standard semiconductor process to achieve a breakthrough in forming the seal ring.

SUMMARY OF THE INVENTION

The present invention therefore proposes a method to form a seal ring. In the method to form a seal ring of the present invention, the conventional semiconductor process is employed to construct the necessary seal ring structure in the micro electro mechanical system. The method of the present invention has the advantage of being compatible with the standard semiconductor process to form the seal ring so as to lower the cost for the mass production to manufacture the micro electro mechanical system.

The method of the present invention to form a seal ring includes first, a substrate including a micro electro mechanical system (MEMS) region, a logic region and a seal ring region is provided. Second, a trench is formed in the micro electro mechanical system region and multiple recesses are formed in the seal ring region. Subsequently, an oxide is filled up the trench and the recesses. Later, a MOS is formed in the logic region. Next, a dielectric layer is formed on the substrate. Then, an etching procedure, such as a contact hole etching procedure, is carried out to partially remove the dielectric layer and simultaneously completely remove the oxide in the multiple recesses to form a seal ring space. Afterwards, a metal plug procedure is carried out after the contact hole etching procedure to fill the seal ring space with a metal to from the seal ring.

The present invention also proposes a semiconductor assembly. In the semiconductor assembly of the present invention, the micro electro mechanical system may co-exist with a metal-oxide semiconductor in the micro electro mechanical system region. The semiconductor assembly of the present invention includes a substrate, a shallow trench isolation, a micro electro mechanical system device, a plurality of recesses, a metal-oxide semiconductor, a dielectric layer and a seal ring. The substrate includes a micro electro mechanical system (MEMS) region, a logic region and a seal ring region surrounding the micro electro mechanical system region. The shallow trench isolation is disposed in the logic region of the substrate. The micro electro mechanical system device is disposed in the micro electro mechanical system region. A plurality of recesses is disposed in the seal ring region of the substrate. The metal-oxide semiconductor is disposed in the logic region. The dielectric layer is disposed on the substrate and on the recesses. The seal ring is disposed in the seal ring region, embedded in the dielectric layer, covering and filling up the recesses. Preferably, at least one of the recesses partially extends from the seal ring region.

These and other objectives of the present invention will no doubt become obvious to those of ordinary skill in the art after reading the following detailed description of the preferred embodiment that is illustrated in the various figures and drawings.

DETAILED DESCRIPTION

The present invention is directed to a method to form a seal ring as well as a seal ring for use in the micro electro mechanical system. In the method to form a seal ring of the present invention, the conventional semiconductor process is integrated with the micro electro mechanical system to construct the necessary seal ring structure in the micro electro mechanical system. The advantage of method of the present invention resides in providing a technique which is compatible with the standard semiconductor process to form the seal ring to lower the cost for the mass production to manufacture the micro electro mechanical system.

Figure 1:
FIGS. 1-10 illustrate a preferred embodiment of the method to form a seal ring of the present invention.
Figure 1:
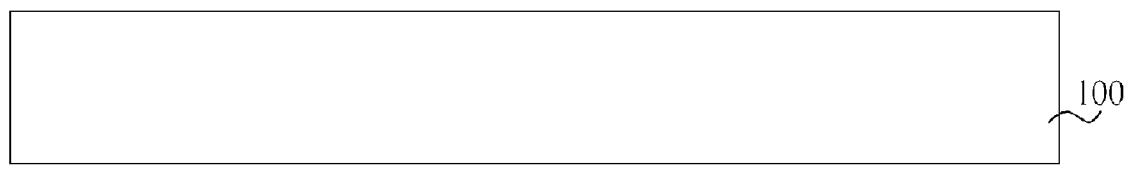

FIGS. 1-10 illustrate an example of the method to form a seal ring of the present invention. In the method to form a seal ring of the present invention, as shown in FIG. 1, a substrate 100 is provided. The substrate 100 includes a micro electro mechanical system (MEMS) region 110, a logic region 120 and a seal ring region 130. The logic region 120 is used to form the required elements, for example a metal-oxide semiconductor. The micro electro mechanical system (MEMS) region 110 is used to form the pre-determined micro electro mechanical system, but it is also possible to form another metal-oxide semiconductor. The seal ring region 130 surrounds the micro electro mechanical system region 110 to form the pre-determined seal ring (not shown) in order to protect the pre-determined micro electro mechanical system. The substrate 100 usually includes Si. The substrate 100 may further include a constructed doped region in advance.

The seal ring region 130 of the present invention may not merely surround the micro electro mechanical system region 110. In one embodiment of the present invention, the seal ring region 130 surrounds the micro electro mechanical system region 110. Or alternatively, in another embodiment of the present invention, the seal ring region 130 of the present invention optionally surrounds both the micro electro mechanical system region 110 and the logic region 120. Different embodiments may meet different demands of different products.

Figure 2:
Figure 2:
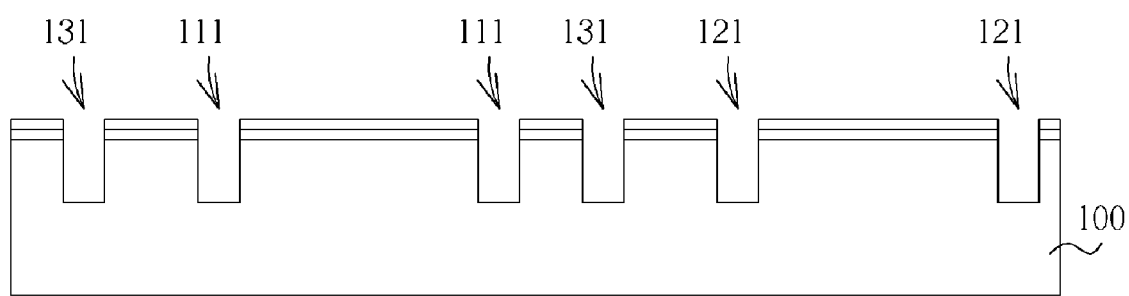

The advantage of method to form the seal ring of the present invention resides in providing a technique which is integrated with the standard semiconductor process. The following steps will substantially correspond the steps in the micro electro mechanical system region 110 and in the seal ring region 130 to the steps in the logic region 120. In other words, when the shallow trenches 121 in the logic region 120 are formed by the shallow trench isolation procedure to segregate the metal-oxide semiconductors, optionally the same lithographic and etching procedures are simultaneously used to form a plurality of recesses 131 in the seal ring region 130 of the substrate 100 for use in anchoring the seal ring in the substrate 100, or further, at least a trench 111 is formed in the micro electro mechanical system region 110, as shown in FIG. 2. For example, in the beginning, there are a pad oxide layer and a nitride layer on the substrate. First a photo resist is used to pattern the nitride layer. Then the patterned nitride layer is used as an etching mask to conduct an etching step, the shallow trench isolation in the logic region of the substrate is accordingly formed to segregate the metal-oxide semiconductors, a plurality of recesses is accordingly formed in the seal ring region of the substrate for use in anchoring the seal ring in the substrate, or moreover, at least a trench is formed in the micro electro mechanical system region after part of the pad oxide layer and the substrate are removed.

Figure 3:
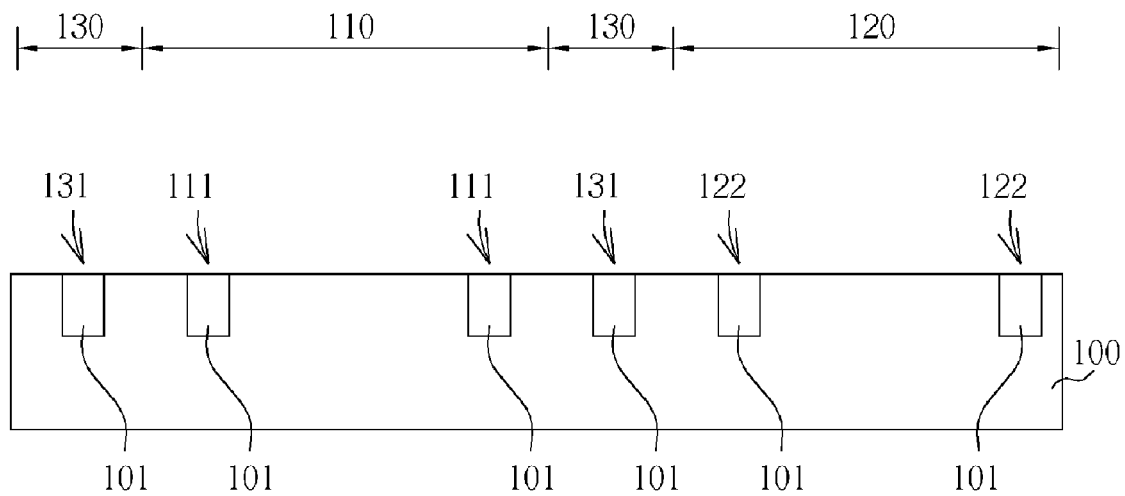

Later, as shown in FIG. 3, when an oxide 101 fills the shallow trench 121 in the logic region 120 of the substrate 100 to form the shallow trench isolation 122, the oxide 101 may also fill the trench 111 in the micro electro mechanical system region 110 as well as in a plurality of recesses 131 in the seal ring region 130. Later on, a chemical mechanical polishing may be optionally carried out to make the oxide 101 fill up the shallow trench 121, the trench 111 and a plurality of recesses 131. The methods to construct the shallow trench 121 in the substrate 100 are well known to persons of ordinary skills in the art and the details will not be discussed here.

Figure 4:
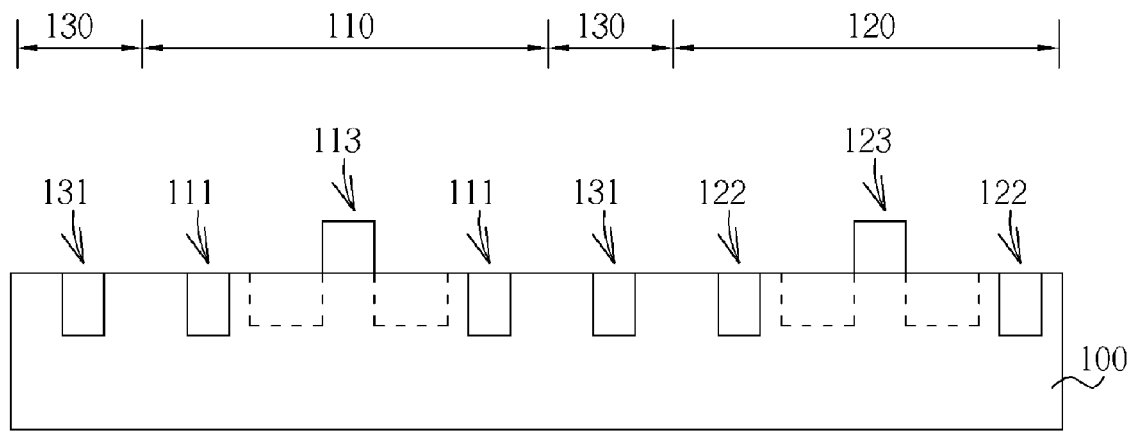

Subsequently, as shown in FIG. 4, a first metal-oxide semiconductor (MOS) 123 is formed in the logic region 120 by means of the conventional semiconductor processes, such as deposition, lithography, etching, ion implantation, or annealing. Optionally, a first micro electro mechanical element 113 may also be formed in the micro electro mechanical system region 110 at the same time. The micro electro mechanical element may be a MOS or an electrode plate. Now, the trench 111 filled up with the oxide 101 in the micro electro mechanical system region 110 is another shallow trench isolation, too. The methods to construct the MOS in the substrate 100 are well known to persons of ordinary skills in the art and the details will not be discussed here.

Figure 5:
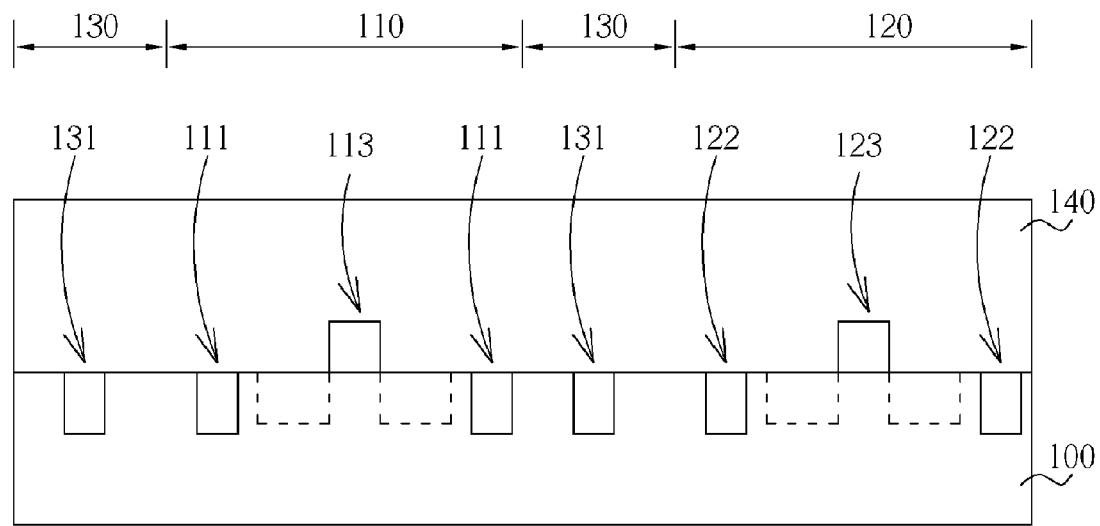

Next, as shown in FIG. 5, a dielectric layer 140 is formed on the substrate 100. If the dielectric layer 140 directly covers the micro electro mechanical system region 110, the first metal-oxide semiconductor 123 in the logic region 120 and the seal ring region 130, the dielectric layer 140 is the conventional interlayer dielectric layer. Generally speaking, the dielectric layer 140 includes an oxide. Later on, a planarization procedure, such as a chemical mechanical polishing procedure may be optionally carried out on the dielectric layer 140.

If the dielectric layer 140 is an interlayer dielectric layer, a contact hole etching procedure is usually necessary after the dielectric layer 140 is formed on the substrate 100. The contact hole etching procedure carried out in the logic region 120 partially removes the dielectric layer 140, so that later the filled conductive material forms elements, for example, the contact plugs for the first metal-oxide semiconductor (MOS) 123 and/or the second MOS 113. Because a plurality of recesses 131 in the seal ring region 130 have been filled with the oxide 101, the above-mentioned contact hole etching procedure would completely remove the oxide 101 in a plurality of recesses 131 and part of the dielectric layer 140 at the same time to form a seal ring space. In order to make sure that the oxide 101 in a plurality of recesses 131 can be completely removed, an over-etching procedure may be carried out after the contact hole etching procedure.

Figure 6:
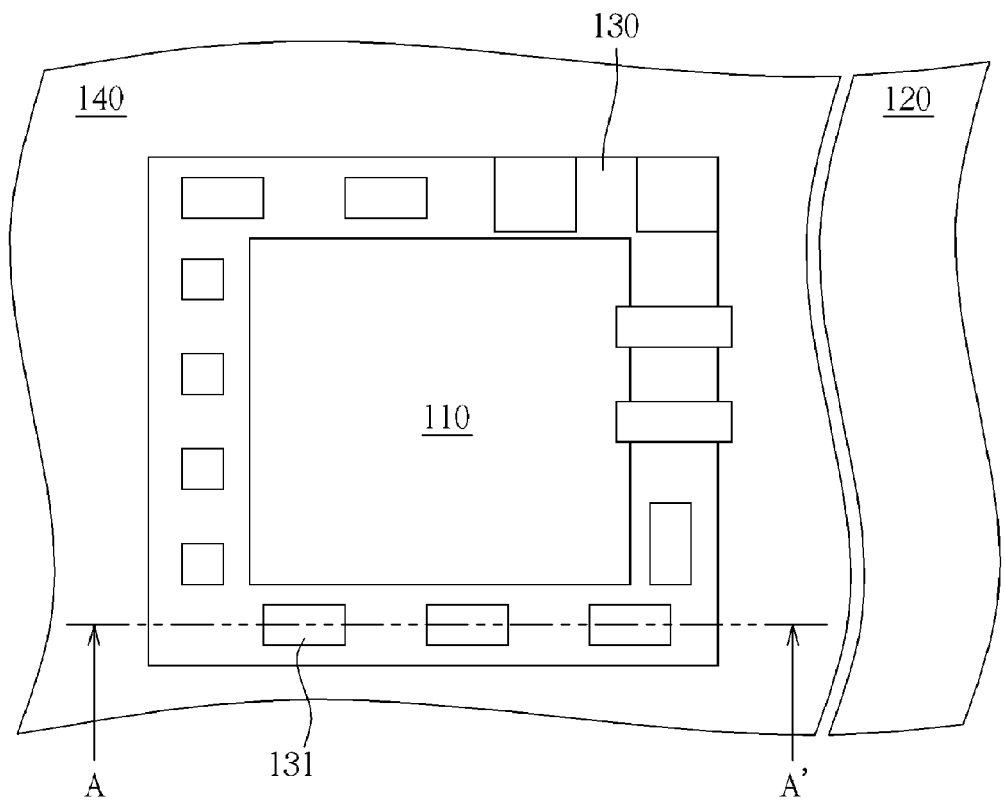

FIG. 6 illustrates a top view of the method to form a seal ring of the present invention in FIG. 5. FIG. 6 further illustrates a cross section line A-A' cutting through a plurality of recesses 131 and the seal ring region 130. FIG. 6 illustrates that the dielectric layer 140 covers the micro electro mechanical system region 110, the logic region 120 and a plurality of recesses 131 in the seal ring region 130. The recesses 131 may be in different sizes and shapes, for example in a rectangular shape such as a square shape or an oblong shape. Preferably, at least one of the recesses 131 may partially extend from the seal ring region 130. More preferably, the recess 131 which partially extends from the seal ring region 130 may be connected to other recesses, such as the shallow trench 121 of the shallow trench isolation 122, in other regions. FIGS. 7-10 illustrate a preferred embodiment along the cross section line A-A'.

Figure 7:
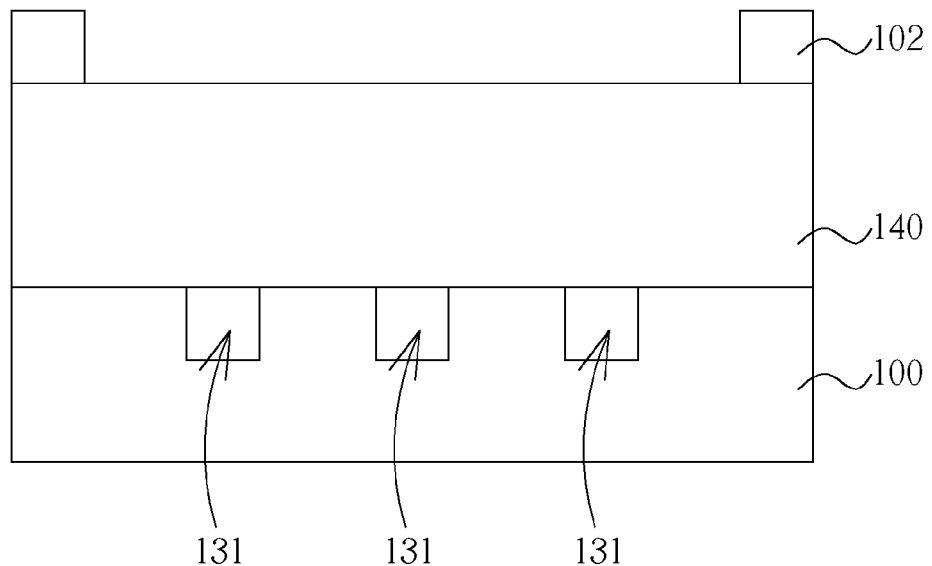
Figure 8:
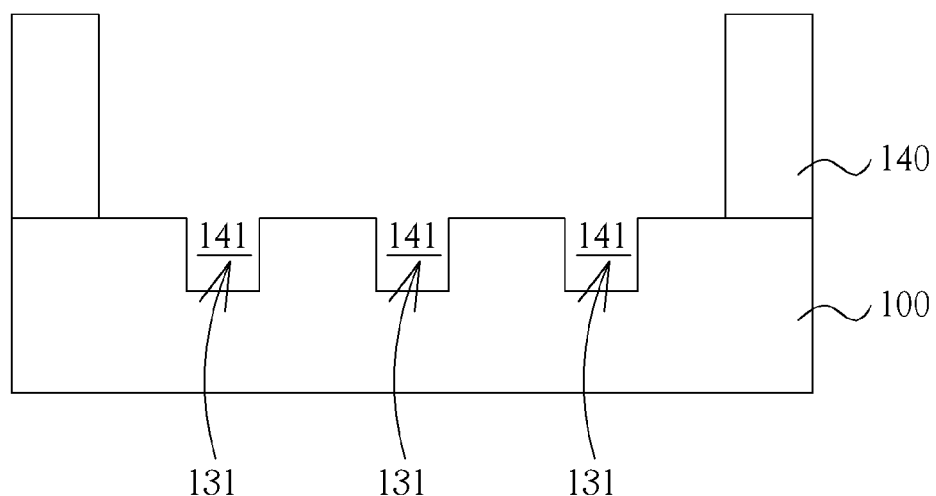

As shown in FIG. 7, when the aforesaid contact hole etching procedure is carried out, a photo resist 102 may be used to facilitate the removal of part of the dielectric layer 140 and the oxide 101 in a plurality of recesses 131 to form the seal ring space 141, as shown in FIG. 8. Because the material filled in a plurality of recesses 131 is similar to the material of the dielectric layer 140, i.e. an oxide, the method of the present invention requires no additional steps to form a plurality of recesses 131 for use in the seal ring in the silicon substrate 100, which is accordingly compatible with the standard semiconductor process.

Figure 9:
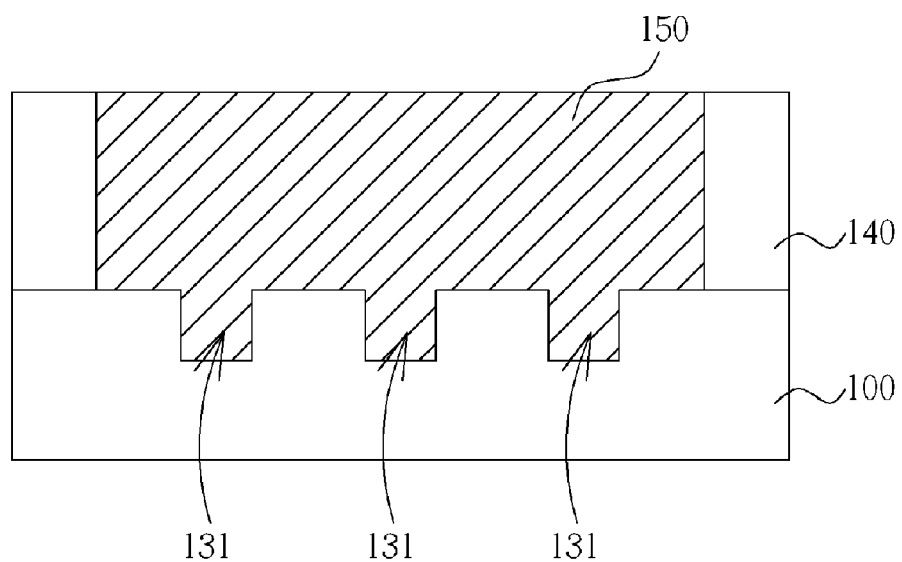

As mentioned above, after the contact hole etching procedure of the standard semiconductor process, a conductive material, such as W, is used and planarized to form the electrical connection elements, i.e. the metal plugs, with other elements. Since the method of the present invention resides in providing a technique to integrate the micro electro mechanical system with the conventional standard semiconductor process, as shown in FIG. 9, the conductive material may be deposited in and filling up the seal ring space 141 at the same time to obtain the seal ring 150.

During the multiple steps to form the seal ring 150, any necessary steps may be carried out any time in the micro electro mechanical system region 110 to form the micro electro mechanical system (MEMS). For example the necessary steps are carried out to form the micro electro mechanical system (MEMS) when the first metal-oxide semiconductor (MOS) 123 is formed in the logic region 120.

If the seal ring region 130 merely surrounds the micro electro mechanical system region 110, there may be a conventional die seal ring (not shown) constructed outside the entire die (not shown) on the substrate 100. Such die seal ring is used to protect the entire chip. However, the seal ring 150 of the present invention is used to protect the micro electro mechanical element. These two are distinctively different.

Figure 10:
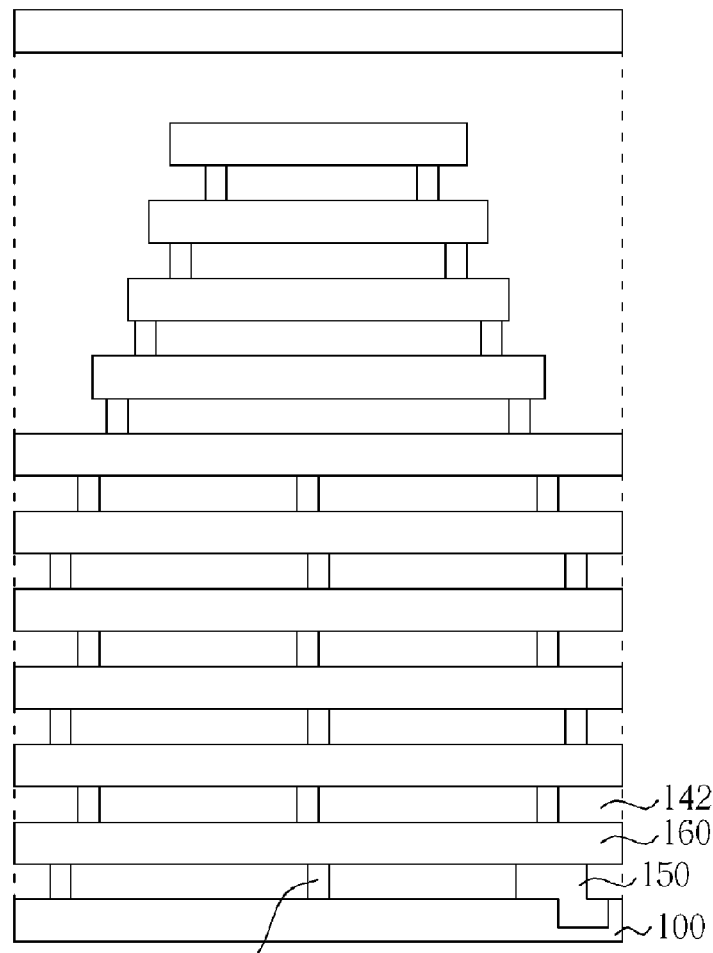

Furthermore, other steps, such as a metal interconnection procedure M1 . . . Mn or an interlayer metal dielectric procedure $IMD_1$ . . . $IMD_n$, may be carried out in the micro electro mechanical system region 110 and/or the logic region 120 and/or the seal ring region 130 (the seal ring 150) in accordance with the standard semiconductor process after the contact hole etching procedure, as shown in FIG. 10. The methods to construct the metal plug 124, the metal interconnection 160 or the interlayer metal dielectric layer 142 on the substrate 100 are well known to persons of ordinary skills in the art and the details will not be discussed here. Some of the micro electro mechanical systems to be formed in the micro electro mechanical system region 110 may be formed along with the metal interconnection procedure according to different practices of the method.

Figure 11:
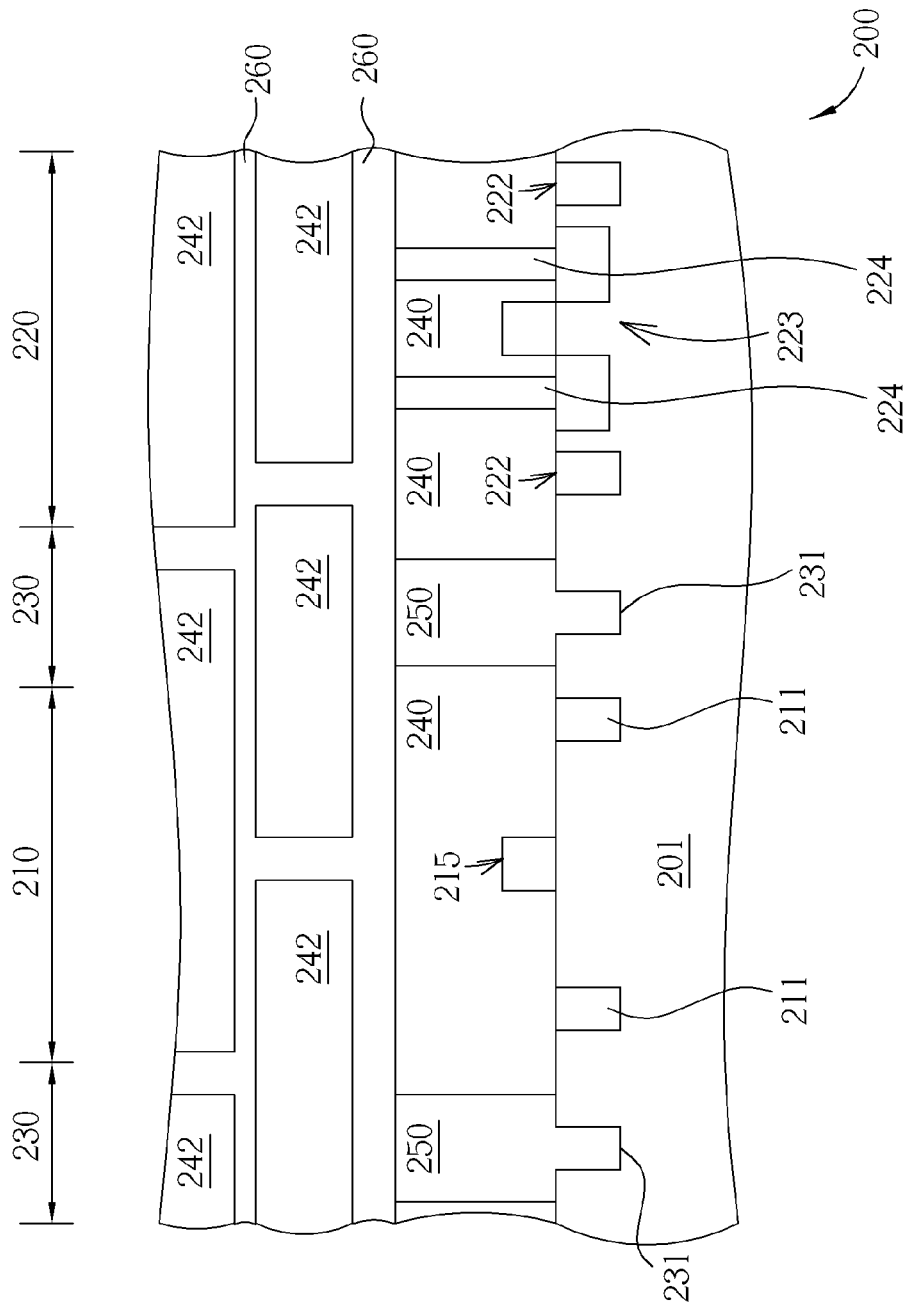
FIG. 11 illustrates a preferred embodiment of the semiconductor assembly of the present invention.

After the above-mentioned steps, a semiconductor assembly is obtained. FIG. 11 illustrates a preferred embodiment of the semiconductor assembly of the present invention. The semiconductor assembly 200 of the present invention includes a substrate 201, a micro electro mechanical system device 215, a shallow trench isolation 222, a plurality of recesses 231, a metal-oxide semiconductor 223, a dielectric layer 240 and a seal ring 250. The substrate 201 includes a micro electro mechanical system (MEMS) region 210, a logic region 220 and a seal ring region 230 surrounding the micro electro mechanical system region 210. The logic region 220 is used to form the required logic elements, for example a metal-oxide semiconductor 223. The micro electro mechanical system (MEMS) region 210 is used to form the pre-determined micro electro mechanical system device 215, but it is also possible to form another metal-oxide semiconductor (not shown). The seal ring region 230 surrounds the micro electro mechanical system region 210 to form the seal ring 250 in order to protect the micro electro mechanical system device 215 in the micro electro mechanical system region 210. The substrate 201 usually includes Si. The substrate 201 may further include a constructed doped region in advance. The seal ring region 230 of the present invention may not merely surround the micro electro mechanical system region 210. In one embodiment of the present invention, the seal ring region 230 surrounds the micro electro mechanical system region 210. Or alternatively, in another embodiment of the present invention, the seal ring region 230 of the present invention optionally surrounds both the micro electro mechanical system region 210 and the logic region 220 (not shown). Different embodiments may meet different demands of different products. If the seal ring region 230 merely surrounds the micro electro mechanical system region 210, there may be a conventional die seal ring (not shown) constructed outside the entire die (not shown) on the substrate 201. Such die seal ring is used to protect the entire chip. However, the seal ring 250 of the present invention is used to protect the micro electro mechanical system device 215 in the micro electro mechanical system region 210. These two are distinctively different.

There is a micro electro mechanical system device 215 in the micro electro mechanical system region 210 and, optionally a shallow trench isolation 211 for use as segregation. There are the shallow trench isolation 222 in the substrate 201, the metal-oxide semiconductor 223 between the shallow trench isolation 222 as well as the metal plug 224 in the logic region 220. There is a seal ring 250 covering and filling up a plurality of recesses 231 in the seal ring region 230. A plurality of recesses 231 make the seal ring 250 stably anchoring in the seal ring region 230 of the substrate 201. The dielectric layer 240 is disposed on the substrate 201 so that the seal ring 250 is embedded in the dielectric layer 240. The metal plug 224 and the seal ring 250 may be of the same material, such as W.

Please refer to the illustrations of FIG. 6. The recesses 131 may be in different sizes and shapes, for example in a rectangular shape such as a square shape or an oblong shape. Preferably, at least one of the recesses 131 may partially extend from the seal ring region 130. More preferably, the recess 131 which partially extends from the seal ring region 130 may be connected to other recesses, such as the shallow trench of the shallow trench isolation, in other regions to strengthen the ability to anchor.

On the dielectric layer 240 of the substrate 201 there may be metal interconnections $M_1$ . . . $M_n$ or interlayer metal dielectric layers $IMD_1$ . . . $IMD_n$ covering the micro electro mechanical system (MEMS) region 210, the logic region 220 (the metal plug 224) and the seal ring region 230 (the seal ring 250). Please refer to the illustrations in FIGS. 1-10 for the variations of the semiconductor assembly 200 of the present invention so the details will not be discussed here.

In the method to form a seal ring of the present invention, the conventional semiconductor process is used to construct the necessary seal ring structure in the micro electro mechanical system. For example, 1) a plurality of recesses for use in the seal ring are formed along with the formation of the shallow trench isolation; 2) the seal ring space is formed in the contact hole etching procedure; 3) the seal ring is formed in the metal plug procedure. The method of the present invention has the advantages of being compatible with the standard semiconductor process techniques to form the seal ring to lower the cost for the mass production to manufacture the micro electro mechanical system.

Those skilled in the art will readily observe that numerous modifications and alterations of the device and method may be made while retaining the teachings of the invention.

What is claimed is:
1. A semiconductor assembly, comprising:
a substrate, comprising a micro electro mechanical system (MEMS) region, a logic region and a seal ring region surrounding said micro electro mechanical system region;
a shallow trench isolation disposed in said logic region of said substrate;
a micro electro mechanical system device disposed in said micro electro mechanical system region;
a plurality of recesses disposed in said seal ring region of said substrate;
a first metal-oxide semiconductor disposed in said logic region;
a dielectric layer disposed on said substrate and on said recesses; and a seal ring made of a metal comprising W, disposed in said seal ring region and embedded in said dielectric layer to cover and fill up said recesses.

2. The semiconductor assembly of claim 1, wherein said substrate comprises Si.

3. The semiconductor assembly of claim 1, wherein at least one of said recesses partially extends from said seal ring region.

4. The semiconductor assembly of claim 1, wherein said recesses are in rectangular shape.

5. The semiconductor assembly of claim 1, wherein said recesses are of different sizes and shapes.

6. The semiconductor assembly of claim 1, further comprising:
a second metal-oxide semiconductor disposed in said micro electro mechanical system region.

7. A semiconductor assembly, comprising:
a substrate, comprising a micro electro mechanical system (MEMS) region, a logic region and a seal ring region surrounding said micro electro mechanical system region;
a shallow trench isolation disposed in said logic region of said substrate;
a micro electro mechanical system device disposed in said micro electro mechanical system region;
a plurality of recesses disposed in said seal ring region of said substrate;
a first metal-oxide semiconductor disposed in said logic region;
a dielectric layer disposed on said substrate and on said recesses;
a seal ring disposed in said seal ring region and embedded in said dielectric layer to cover and fill up said recesses;
a metal plug disposed in said logic region; and
a metal interconnection structure disposed on said seal ring and on said metal plug.

8. The semiconductor assembly of claim 7, wherein said substrate comprises Si.

9. The semiconductor assembly of claim 7, wherein at least one of said recesses partially extends from said seal ring region.

10. The semiconductor assembly of claim 7, wherein said recesses are in rectangular shape.

11. The semiconductor assembly of claim 7, wherein said recesses are of different sizes and shapes.

12. The semiconductor assembly of claim 7, further comprising:
a second metal-oxide semiconductor disposed in said micro electro mechanical system region.

13. The semiconductor assembly of claim 7, wherein said seal ring comprises W.

14. A semiconductor assembly, comprising:
a substrate, comprising a micro electro mechanical system (MEMS) region, a logic region and a seal ring region surrounding said micro electro mechanical system region;
a shallow trench isolation disposed in said logic region of said substrate;
a micro electro mechanical system device disposed in said micro electro mechanical system region;
a plurality of recesses disposed in said seal ring region of said substrate;
a first metal-oxide semiconductor disposed in said logic region;
a dielectric layer disposed on said substrate and on said recesses; and
a seal ring disposed in said seal ring region and embedded in said dielectric layer to cover and fill up said recesses,
wherein said seal ring region surrounds said logic region.

15. The semiconductor assembly of claim 14, wherein said substrate comprises Si.

16. The semiconductor assembly of claim 14, wherein at least one of said recesses partially extends from said seal ring region.

17. The semiconductor assembly of claim 14, wherein said recesses are in rectangular shape.

18. The semiconductor assembly of claim 14, wherein said recesses are of different sizes and shapes.

19. The semiconductor assembly of claim 14, further comprising:
a second metal-oxide semiconductor disposed in said micro electro mechanical system region.

20. The semiconductor assembly of claim 14, wherein said seal ring comprises W.

* * * * *